United States Patent [19]
Libretti

[11] Patent Number: 5,187,431
[45] Date of Patent: Feb. 16, 1993

[54] UNIVERSAL MULTICONTACT CONNECTION BETWEEN AN EWS PROBE CARD AND A TEST CARD OF A "TEST-ON-WAFER" STATION

[75] Inventor: Giuseppe Libretti, Milan, Italy

[73] Assignee: SGS-Thomson Microelectronics s.r.l., Milan, Italy

[21] Appl. No.: 716,704

[22] Filed: Jun. 18, 1991

[30] Foreign Application Priority Data

Jun. 19, 1990 [IT] Italy .................. 83623 A/90

[51] Int. Cl.$^5$ .................................. G01R 1/02
[52] U.S. Cl. .......................... 324/158 P; 324/72.5; 324/158 F; 439/75
[58] Field of Search .......... 324/72.5, 158 P, 158 F; 439/65, 74, 75

[56] References Cited

U.S. PATENT DOCUMENTS

| | | | |
|---|---|---|---|
| 3,028,573 | 4/1962 | Stoehr | 439/65 |
| 3,866,119 | 2/1975 | Ardezzone et al. | 324/158 F |
| 4,357,062 | 11/1982 | Everett | 324/158 F |
| 4,518,914 | 5/1985 | Okubo et al. | 324/158 F |
| 4,667,154 | 5/1987 | Allerton et al. | 324/158 F |
| 4,806,111 | 2/1989 | Nishi et al. | 439/74 |
| 4,859,806 | 8/1989 | Smith | 439/75 |
| 4,884,024 | 11/1989 | Di Perna | 324/158 P |
| 4,952,872 | 8/1990 | Driller et al. | 324/159 P |

FOREIGN PATENT DOCUMENTS

| | | |
|---|---|---|
| 8500168 | 5/1985 | Fed. Rep. of Germany. |
| 3721312 | 5/1989 | Fed. Rep. of Germany. |
| 0278768 | 12/1986 | Japan .................. 324/158 F |
| 0113069 | 5/1987 | Japan .................. 324/158 F |

OTHER PUBLICATIONS

"Testing Apparatus with Selectable Probes and Contactors for use with Changeable Patterns", by Faure et al, IBM Tech. Disc. Bull., vol. 20, #9, Feb. 1978, 324-158F.
Contact HC* Hypertac ® reference explaining Hypertac ® socket.

Primary Examiner—Ernest F. Karlsen
Assistant Examiner—William J. Burns
Attorney, Agent, or Firm—Seed and Berry

[57] ABSTRACT

An universal connector employing a plurality of double female contacts installed with a certain clearance in receptacles of a body which may be suspended in a coupling position with a plurality of male contacts arranged on the top face of an EWS probe card and with a plurality of male contacts arranged on the bottom surface of a test card in a test-on-wafer station, provides a multicontact universal connection for any pair of so equipped cards of the inventories of probe cards and of test cards of the station. The connection is easily set up and exhibits excellent stability and uniformity characteristics of the electrical couplings, while reducing sensibly the time necessary for the setting-up and debugging of the test station for initiating a certain cycle of testing-on-wafer. The stability and reproducibility of the electrical couplings provided by the connection increases the precision of the measurements of critical parameters of the integrated devices with a positive effect on the production yield.

12 Claims, 3 Drawing Sheets

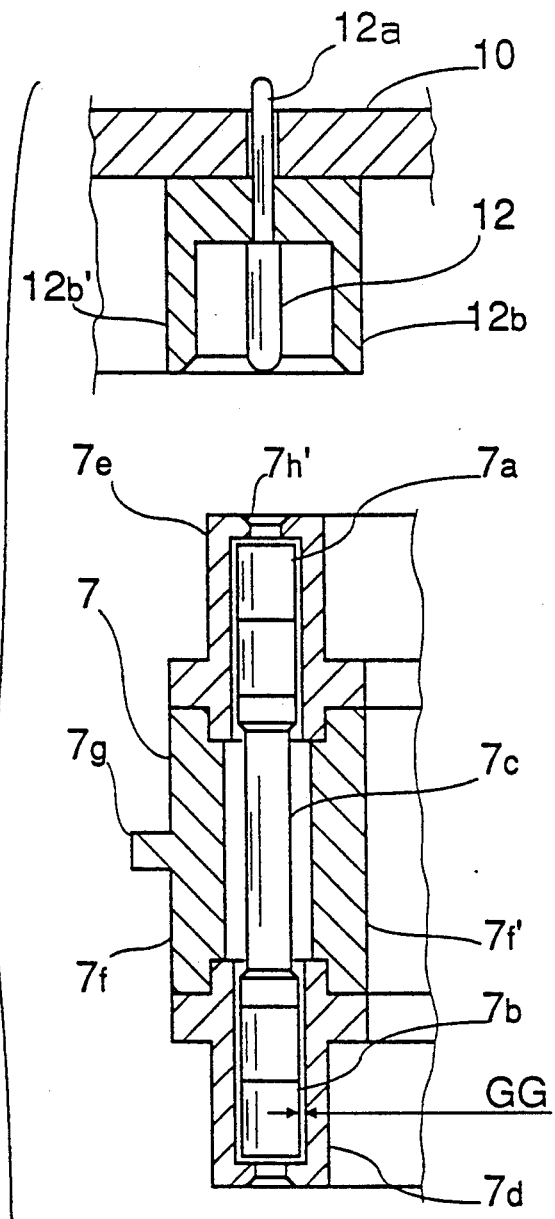
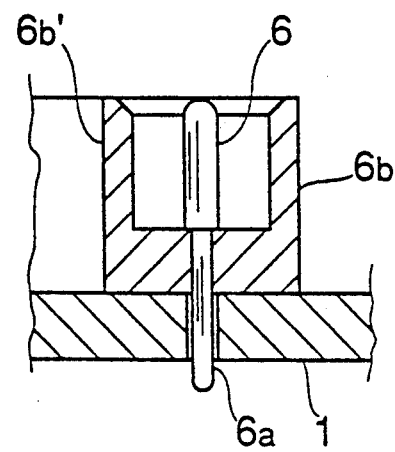
FIG.3
FIG.4

UNIVERSAL MULTICONTACT CONNECTION BETWEEN AN EWS PROBE CARD AND A TEST CARD OF A "TEST-ON-WAFER" STATION

BACKGROUND OF THE INVENTION

1. Field of the Invention

The present invention relates to an universal multicontact connecting system fixture between an EWS probe card and a test card for a "test-on-wafer" station of a production line for semiconductor devices.

2. Description of the Prior Art

Test stations for carrying out quality control testing on wafers of integrated semiconductor devices being fabricated are installations of basic importance for controlling the quality of microelectronic productions. These tests stations are rather complex as they are equipped with sophisticated apparatuses for the automation of the testing operations in order to permit high levels of productivity in performing quality control tests on all the pieces being fabricated.

Commonly, each test station has an inventory of interchangeable EWS probe cards and an inventory of interchangeable test cards. Basically, each card is specifically constructed for testing a specific product. In particular an EWS probe card is the means by which a plurality of minute conducting probes are placed in contact with respective metal pads formed on the front surface of each integrated device being fabricated on the wafer. The electric contact between the point of each probe and the respective contact pad is established by elastic pressure and it is evident that the uniformity and reproducibility of the contact pressure are critical factors for the regularity and precision of the measurements of the electrical parameters which must be carried out on the single integrated device being fabricated. Conversely, a test card is a card which contains the appropriate circuitry for implementing predetermined biasing conditions and detecting functions of electrical parameters through the plurality of contacting probes, as well as control, compensation, and data processing functions in order to present the results of the tests in a most appropriate form to a variety of analytical equipments which determine whether the tested device fits the design specifications.

The electrical connection of the various circuital nodes of the integrated device being tested and which are contacted by means of the probes of the EWS cards, to the respective outputs and inputs of the test card are normally arranged by means of a plurality of cables, provided with end male connectors to fit female sockets present in the two cards. The cables used are often single-conductor cables. Notwithstanding the fact that these cable connections must be made when preparing the test station for testing a particular type of device, they are tedious to make and above all they are a source of problems, in consideration that the number of single-conductor cable connections may be extremely high (from 60 to 180 wires).

The cable connections between the probe card and the test card, notwithstanding the fact that they may not introduce any appreciable load asymmetry of disuniformity on the pressure held contacts established with the pads of the device on the wafer, which could severely affect the contact resistance, which for a load variation of ±10 gr may vary by 10-20 milliohm, still cause a problem because the reciprocal spatial disposal of the connecting cables is hardly stable and reproducible at every setting up of the station. This causes changes of capacitive and inductive couplings among signals which make necessary time consuming compensation interventions with the deployment of the RC network or with other means, which must be performed during a phase of "debugging" of the test station set-up, before the station can start functioning.

These preliminary set-up operations are time consuming and are very critical as often, an imperfect trimming may cause instability of the measurements of particularly critical parameters of the integrated device which may lead to a virtual loss of production.

Vis-a-vis this state of the art, it has been found now that these problems and drawbacks of these known fixtures, may be overcome, while greatly reducing the time necessary for setting up the test station when installing a different EWS probe card and/or a different test card in preparation for the testing of a new type of integrated device.

SUMMARY OF THE INVENTION

These objective and advantages are accomplished by employing a special connection system which utilizes a special multipolar connector having substantially universal characteristics and by which it is possible to quickly and easily connect any EWS probe card to any test card, chosen among the respective card inventories of the test station, and operatively installed in the test station in predisposition of the station for the testing on wafer of a certain semiconductor device. According to an embodiment of the present invention, the system of electrical connection between an EWS probe card and a test card installed in a test station comprises substantially three cooperating parts, two of which are represented by a plurality of male contacts, permanently fixed according to a predetermined arrangement, on a face of each EWS probe card and on a face of each test card, respectively, usable by the test station for performing test-on-wafer of semiconductor devices being fabricated. The male contacts are operatively fixed on the faces of the two types of cards which opposite each other when the cards are mounted on a card supporting structure of the test station. A third part is advantageously unique and universally usable with any pair of probe card and test card and is quickly and easily installed for connecting the various male contacts present on one card to the various male contacts present on the other card. This element of interconnection between the two cards installed in the test station, is constituted by a flat and preferably annular body provided with a plurality of double-female contacts held in a nonrigid manner inside respective receptacles which extend across the thickness of the body. The body into which the plurality of double female contacts is set is preferably made with an electrically insulating material, such as a plastic material. The arrangement on a plane of the double female contacts is "specular" to the arrangement on a plane of the male contacts present on the interchangeable EWS probe cards and test cards, in order to accomplish a reciprocal coupling among all male contacts of a card with correspondent male contacts of the other card in an univocal mode, through the double female contacts of said universal connector. The body of the universal connector with double female contacts may be permanently joined to (or provided with) a supported flange in order to be autonomously supported by the same supporting structure of the cards, in a coupling position which is intermediate to the position of the two cards and such as not to bear on the normally underlying EWS probe card, which is generally suspended in the lowest portion of the card support structure of the test station.

BRIEF DESCRIPTION OF THE DRAWINGS

The different aspects and advantages of the invention will become more evident through the following description of a preferred embodiment and references to the attached drawings, wherein:

FIG. 3 is a partial, exploded, cross-sectional view of the connection system of the invention; and FIG. 4 is a partial cross-sectional view of a detail showing one coupling of the connection.

DESCRIPTION OF THE PREFERRED EMBODIMENT

Figure 1:
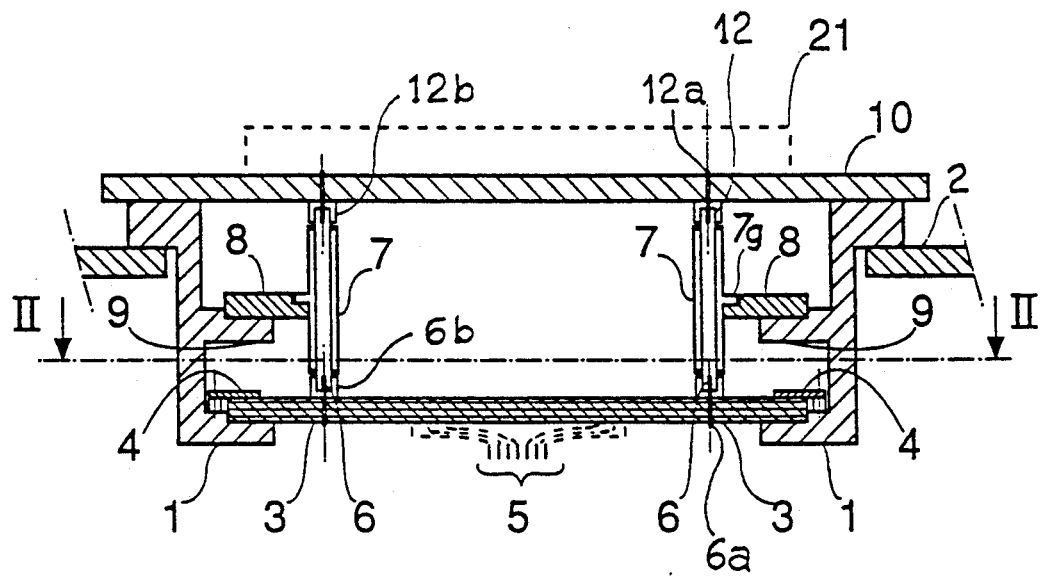
FIG. 1 is a schematic elevation view of a card support structure of a test station for on-wafer testing of integrated devices, which is equipped with the "universal" multicontacts connection system object of the present invention.

With reference to the Figures, wherein the same parts are indicated with the same numbers, a typical tooling of a test-on-wafer station, comprises a card carrier frame 1, which may be solid fixed on a support structure 2 of the test station. Commonly, the card carrier 1 supports an EWS probe card 3 in a lowermost frame of the card carrier body 1. The probe card 3 may be blocked in its seat by means of several turning latches 4. Notably, from the bottom face of the EWS probe card 3 projects a plurality of minute elasticallycantilevered conducting probes terminating with suitably bent coplanar contact points, as indicated, as a whole, with 5 in the schematic illustration of FIG. 1.

An automatic handling apparatus (not shown in the Figure) provides to position a wafer under the probes 5 and, after alignment of one of the integrated devices present on the wafer, the latter is raised to a predetermined height for establishing contacts with the points of the elastic probes 5 for the time necessary to the performance of the test measurements on the integrated device. These last steps are automatically repeated for each device of the wafer.

Figure 2:
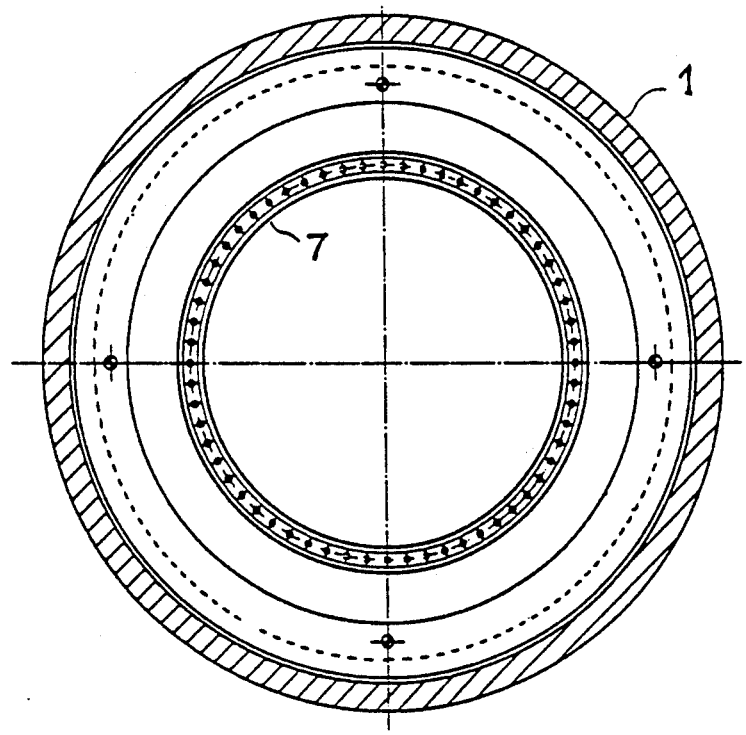
FIG. 2 is a partial plan view on the section plane II—II indicated in FIG. 1.

On the top face of the probe card 3 is arranged a plurality of male contacts, in the form of cylindrical pins 6 parallel to each other and rigidly mounted on the card. Each male contact is electrically connected to one of the probes 5 projecting from the bottom surface of the card. Normally these male contacts are arranged in a regular manner with an uniform spacing along one or more circumferences or arcs of circumferences, through other geometrical arrangements in the assembly plane may be used. In the example shown, the arrangement of the contacts is on a single circumference having a diameter of about 100 millimeters for a total number of 60 contacts, each formed by a male pin having a diameter of 1.5 millimeters. This arrangement is shown schematically in the plan view of FIG. 2. Normally, the pins of the male contacts 6 pass through the thickness of the printed circuit card 3 in order to establish electrical continuity with the respective probes 5.

A universal connector 7 is provided with a number of double female contacts equal to the number of male contacts (60) present on the top surface of the EWS probe card 3. The double female contacts are arranged on the respective assembly plane in a "specular" manner in respect to the male contacts. The double female contacts of the universal connector 7 are mounted in a nonrigid manner inside respective receptacles which extend across the thickness of a toroidal shaped body, which is in turn assembled into the bore of a support flange 8, capable of being suspended into a suitable seat of an immediate, ring-shaped, support shelf 9 of the card carrier body 1, in order that the coupling between each female end of the double female contacts of the toroidal universal connector 7 with the respective male contact 6 of the EWS probe card 3, is established with a certain mechanical clearance in order to prevent that the weight of the universal connector 7 be borne in any substantial way by the probe card 3. A test card 10, containing the specific test circuitry (schematically shown as a whole by means of the dash line profile 11 in FIG. 1) is similarly provided, on its bottom face, with a plurality of male contacts arranged in a mirror-like fashion as the male contacts on the top face of the probe card 3. This second plurality of male contacts coupled with the plurality of top female sockets of the double female contacts of the universal connector 7, for establishing an electrical continuity between pairs of male contacts of the probe card 3 and of the test card 10, respectively. Of course, in case of an arrangement of the contacts in a nonunivocal manner (as in the case of a uniform distribution on a circumference), the two male portions of the universal connection system and the universal connector (i.e. all three parts of the connection) may be provided with a visual index or with a mechanical dovetailing joint in order to ensure an univocal way of connecting together of the three parts.

In the partial, exploded, sectional view of FIG. 3, the peculiar features of the universal mulitcontact connection system of FIG. 1 are clearly shown. The male contacts 6 of the probe card 3, are set into a circular channel formed by the two concentrically spaced vertical walls 6b and 6b' of an annular body of an insulating material. The stems 6a of the male contact pins 6 emerge from the bottom surface of the probe card 3 and are soldered to a respective conductive track of the printed circuit card.

The male contacts present on the bottom face of the test card 10 are entirely similar to the male contacts of the probe card 3. Also in this case, the pins 12 are provided with stems 12a, whose extremity project from the top surface of the card 10 where they are soldered to a respective conductive track of the printed circuit of the test card. The plurality of male contacts 12 is set into a circular channel formed by the lateral concentric walls 12b and 12b' of an annular channel of electrically isolated material through the base of which the male contracts are held.

The universal connector 7 with double female contacts employs a plurality of contacts, each having two female socket ends 7a and 7b connected together by a stem 7c. The socket ends of each double female contact are housed with a certain clearance GG into cylindrical cavities formed in two toroidal bodies of insulating material 7c and 7d, provided with coaxial holes 7h and 7h' for the passage of the respective male contact pins. The two toroidal assembly bodies 7c and 7d are in turn assembled between two coaxial annular spacer bodies 7f and 7f', which may be made of metal. The outer annular spacer 7f is provided with a circular ridge or flange 7g for fitting with an assembly flange 8 (FIG. 1).

In the particular shown in FIG. 4, the coupling between a male contact and the respective female socket terminal of the universal connector is shown to have a mechanical clearance GG' in order to ensure that the intermediate universal connector assembly does not bear on the EWS probe card 3.

The male contact arrays with which the plurality of cards of the whole card inventory of a test station are furnished, are of relatively low cost. Therefore to equip all the probe cards and all the test cards with such a plurality of male contacts, does not imply a major expenditure. By contrast, the universal connector equipped with the double female contacts is advantageously unique and may be used for coupling together any EWS probe card and any test card. The female contacts are preferably of a type suitable to ensure a low contact resistance, a high reliability and durability under the conditions of use of the universal connector.

Of course it is also possible to mount permanently female type contacts on all the cards and to equip the universal connector with mating double-ended male contacts. However this alternative embodiment may be less preferable than the preferred embodiment described above in terms of the greater cost of equipping all the cards with more expensive and cumbersome female sockets.

Figure 5:
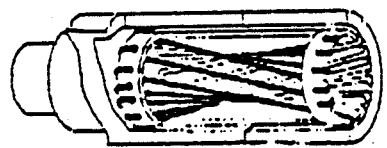
FIG. 5 is an isometric view of a prior art female contact socket.

As shown in FIG. 5, preferably, the female contacts have a socket formed by a plurality of wires tensioned between two axially spaced rings and normally held at a certain inclination in respect to the socket axis to form a hyperboloid-shaped sleeve, as the female contacts marketed in Italy by the firm Connei S.p.A. Connettorie Elettrici Industriali, under the trade name of HC contacts and the trade mark HYPERTAC ®. The metal wires have the property of stretching for accommodating a coupling male pin inserted in the socket "wrapping" themselves around the pin and providing a number of linear contact paths.

The mechanical clearance with which the double female contacts are assembled inside the receptacles of the universal connector and the mechanical clearance which is purposely ensured between the "suspended" universal connector and the underlying EWS probe card, together with the intrinsic stability of the contact resistance ensured by the female contacts used for forming the universal connector, confer to the complete connection a remarkable stability, uniformity and reproducibility of contact conditions while greatly simplifying the preliminary set-up operations when prearranging the station for a certain test cycle. Above all, the greatly improved stability and reproducibility of the conditions of electrical coupling of the various bias and measurement signals afforded by the electrical connection system of the instant invention, has been found to have a remarkably positive effect on the production yield. This unsuspectable result may be attributed to the increased reliability and precision in testing particularly critical electrical parameters of the integrated devices.

What I claim is:

1. A universal multicontacts connection device for connecting an EWS probe card and a test card installed in a test-on-wafer station having a card support structure, which comprises a first plurality of male contacts permanently mounted on the top surface of a probe card and individually connected to a respective probe projecting from the bottom surface of said probe card;

a second plurality of male contacts permanently mounted on the bottom face of a test card the test card being mounted in a carrier frame above the probe card;

a universal connector provided with a plurality of double ended female contacts, capable of operatively mating with the male contacts of said first and second pluralities of male contacts, said female contacts being mounted with a certain clearance inside respective receptacles formed in a retaining and substantially electrically insulating body;

said pluralities of female contacts being disposed on their respective assembly planes in a substantially specular manner in order to make possible a reciprocal coupling among said male contacts of said probe card with respective male contacts of said test card through said double ended female contacts of said universal connector;

means for supporting said electrically insulating body in a coupling position between the bottom end female contacts of said universal connector and the male contacts of said probe card, without substantially bearing on said probe card such that the weight of the body does not substantially bear on.

2. A universal multicontacts connection device for connecting an EWS probe card and a test card installed in a test-on-wafer station having a card support structure, which comprises a first plurality of male contacts in the form of parallel pins permanently mounted on the top surface of a probe card and individually connected to a respective probe projecting from the bottom surface of said probe card;

a second plurality of male contacts in the form of parallel pins permanently mounted on the bottom face of a test card the test card being mounted in a carrier frame above the probe card a universal connector provided with a plurality of double female contacts mounted with a certain clearance inside respective receptacles formed in a substantially isolating body;

said pluralities of contacts being disposed on their respective assembly planes in a substantially specular manner in order to make possible a reciprocal coupling among said male contacts of said probe card with respective male contacts of said test card through said double female contacts of said universal connector;

means for supporting said electrically insulating body in a coupling position between the bottom female contacts and the male contacts of said probe card.

3. The universal connection device as defined in claim 2, wherein said double female contacts are mounted with a certain axial and lateral clearance within said receptacles and said means for supporting said body are capable of suspending said body in said coupling arrangement with a predetermined vertical clearance.

4. The universal connection device of claim 2, wherein each of said double female contacts has two female end sockets formed by a plurality of metal wires tensioned between two axially spaced rings at an inclination angle in respect to the socket's axis and capable of stretching for accommodating a coupling male pin.

5. The universal connection device of claim 2, wherein said pluralities of male and female contacts are disposed in at least an arc of circumference on respective planes.

6. The universal connection device of claim 5, wherein an indexing means is present on each coupling part for ensuring an univocal way of coupling together.

7. A test-on-wafer station comprising:
a card carrier frame;
a probe card mounted in and supported by said card carrier frame;
a plurality of electrical contacts at a top surface region of said probe card, said contacts being positioned to be electrically coupled by a device above said probe card;
a support structure for supporting said carrier frame;
a test card positioned above said carrier frame, said test card having a plurality of electrical contacts at a bottom surface region thereof for electrically coupling to a member below said test card;
a universal connector member for electrically connecting said test card to said probe card, said universal connector member having a plurality of electrical contacts positioned at a top surface region thereof and at a bottom surface region thereof, said electrical contacts on the top surface region thereof being aligned with the electrical contacts of said test card and the electrical contacts at a bottom surface region thereof being aligned with the electrical contacts on said probe card, said contacts at both said top region and said bottom region being engageable in a mating electrical coupling arrangement with said test card and said probe card, respectively, by relative axial displacement of electrical contacts between said test card, said universal connector, and said probe card;
a support shelf extending from said carrier frame, said support shelf being positioned for supporting said universal connector member; and
a ridge extending from said universal connector member and positioned to contact said support shelf of said carrier frame such that said universal connector is suspended by said carrier body with the weight of said universal connector member being substantially borne by said carrier body to prevent significant weight of the universal connector member from being borne by said probe card.

8. The apparatus according to claim 7, wherein said contacts extending from said top surface region of said universal connector and said bottom surface region of said universal connector are female contacts, said contacts having an aperture for receiving a male member for electrically coupling to said test card and said probe card, respectively, said test card and said probe card each having male electrical contact members positioned for engaging said female electrical contacts of said universal probe card member.

9. The apparatus according to claim 7, wherein said universal connector is supported a selected clearance distance above said probe card by said support shelf to insure that the weight of the universal connector member is not borne by the probe card.

10. The apparatus according to claim 7, wherein said electrical contacts on said test card, said universal connector member, and said probe card are circularly arranged, said universal connector member being a cylindrical member supported within a cylindrical aperture in said carrier frame.

11. The apparatus according to claim 7 further including:
a plurality of electrical probes extending from a bottom surface of said probe card, said electrical probes being elastically cantilevered, conducting probes positioned for contacting selected locations on the semiconductor wafer; and
electrical connections extending through said probe card from said electrical contacts in the top surface region to the electrical probes in the bottom surface region for carrying out electrical tests of devices on said wafer.

12. The apparatus according to claim 7 wherein said female contact within said universal connector member is positioned within a cylindrical cavity at respective top and bottom regions of said universal connector member, said cylindrical cavity having a larger diameter than the outside diameter of said female contact member mounted therein to provide a selective clearance between said cavity and said female contact.

* * * * *

UNITED STATES PATENT AND TRADEMARK OFFICE
CERTIFICATE OF CORRECTION

PATENT NO. : 5,187,431
DATED : Feb. 16, 1993
INVENTOR(S) : Giuseppe Libretti

It is certified that error appears in the above-identified patent and that said Letters Patent is hereby corrected as shown below:

In column six, claim one, line 26, after "said probe card,", please delete "without substantially bearing on".

In column six, claim one, lines 27 and 28, please delete "said probe card such that the weight of the body does not substantially bear on" and substitute therefor -- such that the weight of the body does not substantially bear on said probe card --.

In column six, claim two, line 55, please delete "card" and substitute therefor -- card, such that the weight of the body does not substantially bear on said probe card --.

Signed and Sealed this

Thirtieth Day of November, 1993

Attest:

BRUCE LEHMAN

Attesting Officer

Commissioner of Patents and Trademarks